United States Patent [19]

Fushiki

[11] Patent Number: 4,549,098

[45] Date of Patent: Oct. 22, 1985

[54] DEVICE FOR GENERATING A VARIABLE CONTROL SIGNAL

[75] Inventor: Tatsuo Fushiki, Hamamatsu, Japan

[73] Assignee: Nippon Gakki Seizo Kabushiki Kaisha, Hamamatsu, Japan

[21] Appl. No.: 410,999

[22] Filed: Aug. 24, 1982

[30] Foreign Application Priority Data

Sep. 9, 1981 [JP] Japan ............................... 56-141964

[51] Int. Cl.$^4$ .................. H03K 5/19; H03K 5/24; H04R 5/04; H04B 1/16
[52] U.S. Cl. ............................ 307/352; 307/358; 307/359; 307/308; 330/129; 377/45; 381/102; 381/109
[58] Field of Search ............ 381/102, 104, 109; 330/129, 279; 377/26, 45; 307/352, 353, 358, 359, 308; 328/1, 3-5, 150-151

[56] References Cited

U.S. PATENT DOCUMENTS

| | | | |
|---|---|---|---|
| 3,961,281 | 6/1976 | Woolling, Jr. ..................... | 330/129 |
| 4,087,793 | 5/1978 | Lucas ............................... | 455/232 X |
| 4,145,743 | 3/1979 | Diciurcio ........................ | 307/359 X |
| 4,145,748 | 3/1979 | Eichelberger et al. ........... | 377/45 X |
| 4,158,129 | 6/1979 | Baumgartner ................... | 377/45 X |
| 4,320,255 | 3/1982 | Null et al. ....................... | 381/109 |
| 4,349,779 | 9/1982 | Ono .................................. | 381/104 X |
| 4,390,834 | 6/1983 | Ohshita ............................ | 381/109 |
| 4,401,974 | 8/1983 | Jarrett et al. .................... | 307/353 X |
| 4,449,104 | 5/1984 | Agnor et al. ..................... | 330/279 |

Primary Examiner—Larry N. Anagnos
Attorney, Agent, or Firm—Cushman, Darby, Cushman

[57] ABSTRACT

A device for generating a variable and adjustable control signal is provided. The device is of the type in which the control signal is generated in response to the manipulation of the device by an operator and is applied to suitable controlled amplifiers such as voltage controlled amplifiers or filters. The device comprises variable voltage generating member and a holding circuit coupled thereto. The voltage generating member is capable of delivering a voltage corresponding to the location where the operator touches or presses and when the voltage generating member is not touched the voltage generating member is inhibited from delivering a voltage. The holding circuit delivers a first signal corresponding to the voltage delivered under the manipulation of the voltage generating member, and holds a voltage corresponding to the previously manipulated location and delivers a second signal corresponding to the held voltage during the time the voltage generating member is not manipulated. Thus, either one of the first and second signals is used as a control signal variably adjusted by manipulation of the voltage generating member.

8 Claims, 8 Drawing Figures

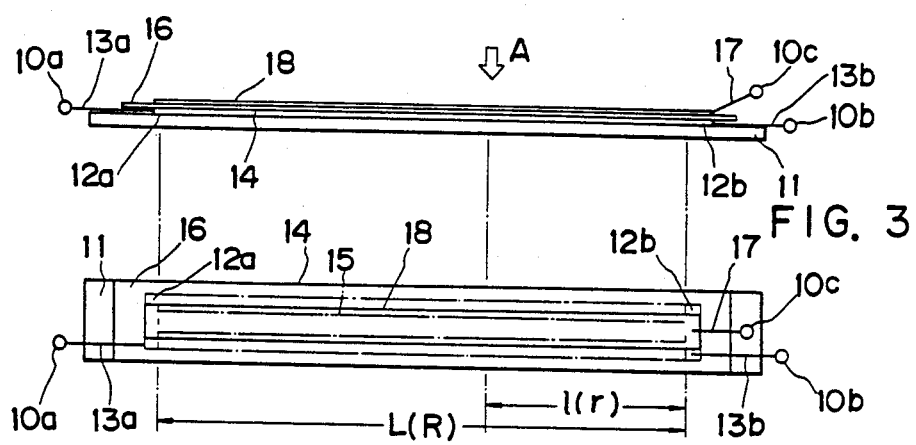
FIG. 3
FIG. 4
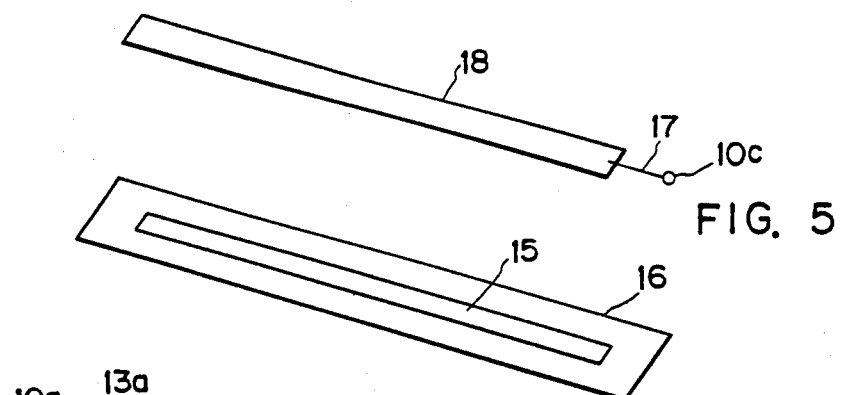
FIG. 5
FIG. 6
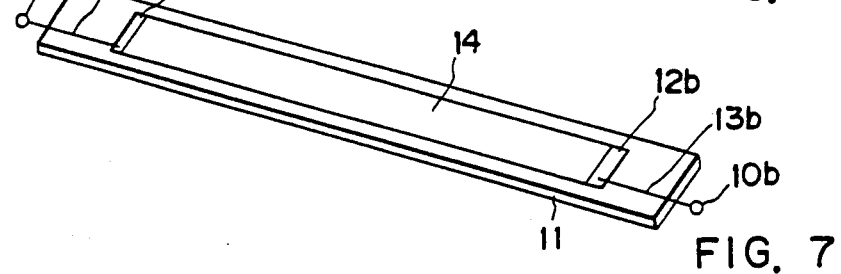
FIG. 7

DEVICE FOR GENERATING A VARIABLE CONTROL SIGNAL

BACKGROUND OF THE INVENTION (a) Field of the Invention

This invention relates to a device for generating a variable control signal, and more particularly to a device for generating a variable control signal of the type in which the control signal is generated in response to the manipulation of the device by an operator and is applied to suitable circuits as a control signal thereof, e.g., when the device is employed for audio equipments, such as voltage controlled amplifiers or voltage controlled filters, for controlling such as sound volume or sound quality.

(b) Description of the Prior Art

Recently, a new push-button type adjusting circuit for controlling such as sound volume, sound quality or the like has been used extensively in the fields of audio equipment in place of an old adjusting circuit which uses a variable type resistor. The known push-button type adjusting circuit comprises a device for generating a variable control signal in response to the depression or manipulation of a switch or a push-button, for controlling such as a voltage controlled amplifier or a voltage controlled filter.

One of typical examples of such push-button type adjusting circuits is illustrated in FIG. 1, for example, which is used in a sound volume adjusting circuit as one example.

The sound volume adjusting circuit particularly shown in FIG. 1 comprises a voltage controlled amplifier 1 for amplifying an audio signal the gain of which is varied in accordance with a control voltage Vc, and a control signal adjuster 2 which generates the control voltage Vc in response to the manipulation thereof by an operator. The control signal adjuster 2 comprises two push-button switches 3 and 4, a clock generator 5, two AND gates 6 and 7, an up-down counter 8, and a digital to analog (D/A) converter 9. Each of the push-button switches 3 and 4 is supplied at one terminal with a logical value "1", and the former is used for increasing a sound volume and the latter is used for lowering the sound volume. The clock generator 5 generates clock signals having a constant time interval therebetween. The other terminals of the two push-button switches 3 and 4 are coupled respectively to one input of the AND gates 6 and 7, the other inputs thereof being coupled to the output of the clock generator 5. Thus, the up-down counter 8 increases the count contents thereof upon reception of the clock signals from the AND gate 6 during the time the push-button switch 3 is being turned on, while the up-down counter 8 decreases the count contents thereof upon reception of the clock signals from the AND gate 7 during the time the push-button switch 4 is being turned on. The D/A converter 9 converts the counted value of the up-down counter 8 to the corresponding analog voltage (which is used as the control voltage Vc).

With the sound volume adjusting circuit constructed as above, the control voltage Vc of the control signal adjuster 2 is raised during the depression of the push-button 3 thereby to raise the gain of the amplifier 1 for higher sound volume, while the control voltage Vc is lowered during the depression of the push-button switch 4 thereby to lower the gain of the amplifier 1 for lower sound volume. With the application of the control signal adjuster 2, a sound quality adjusting circuit can be implemented by replacing the voltage controlled amplifier 1 in FIG. 1 with a voltage controlled filter, whereby sound quality can be varied similary as above described by depressing either one of the push-button switches 3 and 4.

In this control signal adjuster 2 shown in FIG. 1, difficulty has been encountered in some points particularly when the control signal adjuster is incorporated with the push-button type adjusting circuit for controlling sound volume or quality in audio equipment. Since the variation speed of the control signal Vc generated by the control signal adjuster 2 is determined in accordance with the time interval of the clock signals generated by the clock generator 5, there are tradeoffs to consider between the time interval of the clock signals and the operational facilitation of the control signal adjuster 2. More in detail with a shorter time interval of the clock signal, the variation speed of the sound volume or quality is increased, however, it is difficult to carry out a fine adjustment of the sound volume or quality. Conversely, with a longer time interval of the clock signal, the variation speed of the sound volume or quality is decreased, however, in this case, it is also difficult to carry out a quick adjustment of the sound volume or quality. Furthermore, since the adjustment of the sound volume or quality is performed by actuating the two push-button switches 3 and 4, it is naturally impossible to visually recognize the degree of the sound volume or quality at the time of manipulation.

SUMMARY OF THE INVENTION

It is, therefore, a principal object of the present invention to provide a novel device for generating a variable control signal.

It is another object of the present invention to provide the device as above in which a fine and quick adjustment of a control signal can be attained by an operator's manipulation of the device.

It is still another object of the present invention to provide the device which is capable of giving a visual recognition of an adjustment to the operator, thereby enabling an easy operation of the device.

According to the present invention, there is provided a device for generating a variable and adjustable control signal which comprises: variable voltage generating means which is capable of delivering a voltage corresponding to the location where the voltage generating means is manipulated and when the generating means is not manipulated the generating means is inhibited from delivering a voltage; holding circuit means coupled to the variable voltage generating means for delivering a first signal corresponding to the voltage delivered under manipulation, and holding a voltage corresponding to the previously manipulated location and delivering a second signal corresponding to the held voltage during the voltage generating means is not manipulated; and an output terminal coupled to the output of the holding circuit means for receiving either one of the first and second signals as a control signal variably adjusted by manipulation of the voltage generating means.

The foregoing and other objects, the features and the advantages of the present invention will be pointed out in, or apparent from, the following description of the preferred embodiments considered together with the accompanying drawings.

BRIEF DESCRIPTION OF THE DRAWINGS

FIGS. 3 and 4 are side and plan views of a variable resistor used in the device shown in FIG. 2;

FIGS. 5 through 7 are perspective views of each element constituting the variable resistor shown in FIGS. 3 and 4.

DETAILED DESCRIPTION OF THE PREFERRED EMBODIMENTS

Figure 1:
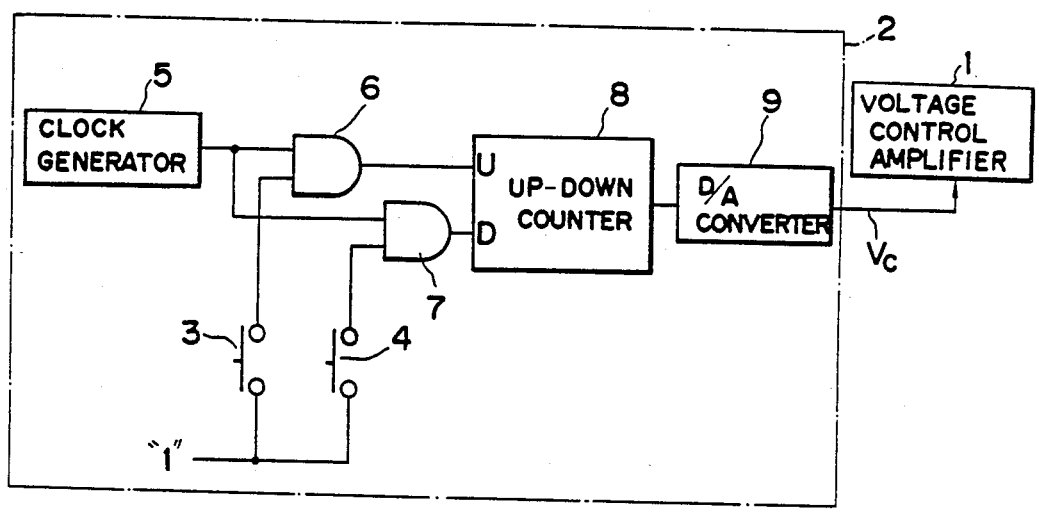
FIG. 1 is a schematic block diagram of a prior art typical push-button type adjusting circuit applied to the adjustment of sound volume.
Figure 2:
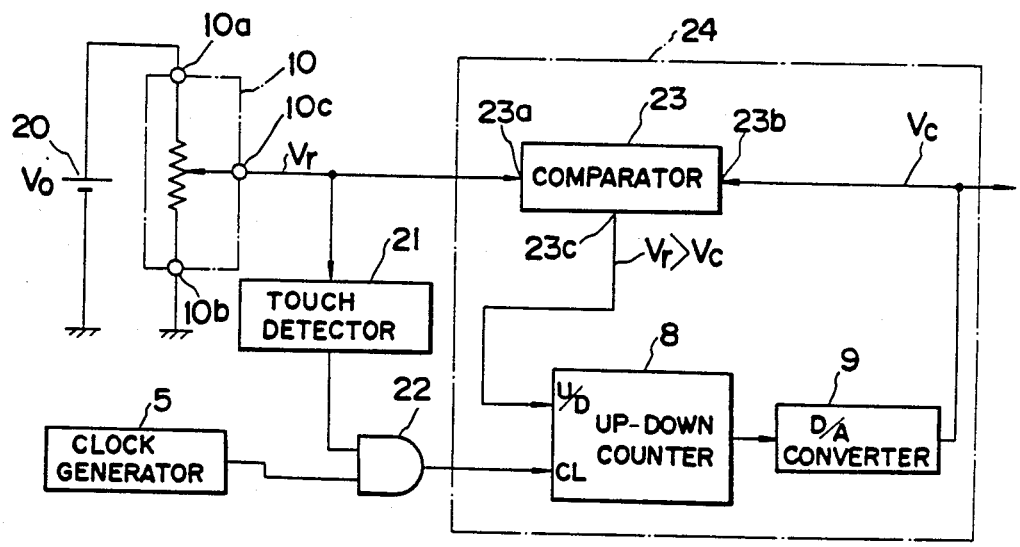
FIG. 2 is a schematic block diagram of the device for generating a variable control signal as one embodiment according to the invention.

FIG. 2 shows a block diagram illustrating a circuit arrangement of an embodiment according to the invention, wherein identical reference numerals have been used to designate corresponding parts of FIG. 1. In FIG. 2, a reference numeral 10 denotes a variable resistor varying a resistance value between terminals 10b and 10c depending upon the position of the variable resistor 10 where an operator touches or presses. A detailed construction of the variable resistor 10 is shown in FIG. 3 (side elevational view), FIG. 4 (plan view), and FIGS. 5 through 7 (perspective views of each element constituting the variable resistor 10).

The variable resistor 10 comprises a resistive body 14, a spacer 16, and an elastic conductor 18. As best shown in FIG. 7, the resistive body 14 is formed on one surface of an insulating substrate 11 having a thin elongated rectangular shape. The resistive body 14 lying along the longitudinal direction of the substrate 11 is similar in shape to but smaller in area than that of the substrate 11, and has at opposite ends a pair of conductor pieces 12a and 12b electrically connected thereto. Lead wires 13a and 13b are provided for electrical connection between the conductor pieces 12a and 12b and terminals 10a and 10b, respectively.

The spacer 16 is of a filmy nature, and as particularly shown in FIG. 6, has centrally thereof along the longitudinal direction an elongated rectangular slit 15 with a smaller width than that of the resistive body 14 so that a part of the resistive body can be exposed from the slit 15 when the spacer 16 is layed on the surface of the substrate 11.

The elastic conductor 18 (made of such as copper film, plastic film coated with a conductive material, or the like) of an elongated film has at one end thereof along its longitudinal direction one end of a lead wire 17 connected thereto, the other end of the lead wire 17 being connected to a terminal 10c, as shown in FIG. 5. The elastic conductor 18 is used for covering the slit 15 of the spacer 16 by disposing it upon the spacer 16.

The variable resistor 10 is assembled in a single body by disposing the insulating substrate 11 with the resistive body 14, the spacer 16, and the elastic conductor 18 in overlying alignment with one another in this order. With the variable resistor 10 thus fabricated, upon manual depression of the elastic conductor 18 (e.g., with a finger), from the upper to the lower as shown by an arrow A in FIG. 3, the elastic conductor 18 and resistive body 14 come into contact with each other at the position where the operator depresses. Thus, the resistance value between the terminals 10b and 10c or between the terminals 10a and 10c becomes one corresponding to the depressed position. More in detail, it is assumed that the resistive body 14 has a uniform resistance throughout the entire length L thereof, and has a resistance value R between the terminals 10a and 10b and that the position apart from the end, at the terminal 10b side of the resistive body 14, by the distance l comes into contact with the elastic conductor 18 by the depression thereof as shown by an arrow A in FIG. 3, then the resistance value r between the terminals 10b and 10c is defined as $$r = R \times \frac{l}{L} \tag{1}$$

Referring now back to FIG. 2, the variable resistor 10 is supplied at its terminal 10a with a voltage $V_o$ from a direct current voltage source 20, and the terminal 10b is grounded. Thus, a voltage Vr is developed at the terminal 10c which is expressed as $$Vr = V_0 \times \frac{r}{R} \tag{2}$$

$$= V_0 \times \frac{l}{L}$$

A reference numeral 21 denotes a touch detector which is so constructed to generate a binary logical signal "1" during the time the voltage Vr is being developed under the depression operation of the variable resistor 10. The output of the touch detector 21 is coupled to one of the input terminals of an AND gate 22, the other of the input terminals being provided with an output of a clock generator 5. The clock generator 5 generates clock signals having an extremely short time intervals (e.g. 10 μsec.), which clock signals are passed through the AND gate 22 when the output "1" of the touch detector 21 is applied to the input terminal of the AND gate 22. The output of the AND gate 22 is coupled to a clock input terminal CL of an up-down counter 8. The up-down counter 8 is so constructed to count up the clock signals supplied to the clock input terminal CL through the AND gate 22 when a "1" signal is applied to an input terminal U/D of the up-down counter 8, and to count down the clock signals during a "0" signal is applied to the input terminal U/D. The output of the up-down counter 8 is delivered to a digital to analog (D/A) converter 9 where the counted output is transformed to an analog voltage signal (this voltage signal serves as a control voltage Vc) corresponding to the counted output.

A comparator 23 is provided for comparing voltages applied to first and second input terminals 23a and 23b. The comparator 23 generates at an output terminal 23c a "1" signal when the voltage applied to the first input terminal 23a is higher than that applied to the second input terminal 23b, and generates a "0" signal at the condition other than the above. The comparator 23 is supplied at the input terminal 23a with the voltage Vr from the terminal 10c of the variable resistor 10, and is supplied at the input terminal 23b with the control voltage Vc from the D/A converter 9, the output from the output terminal 23c being supplied to the input terminal U/D of the up-down counter 8.

The operation of the device thus constructed for generating a variable control signal will now be described. During the time the variable resistor 10 is not being manipulated or depressed, the touch detector 21 delivers a "0" signal so that the clock signals from the clock generator 5 are not supplied to the up-down counter 8 thereby causing the count value and hence the control voltage Vc to remain unchanged. Now, under the depression manipulation of the variable resistor 10 with a voltage Vr corresponding to "l/LV$_o$" being delivered, the output of the touch detector 21 changes to a "1" signal so that the clock signals from the generator 5 start to be supplied to the up-down counter 8. At this time instant, if a condition Vr>Vc is met the comparator 23 delivers a "1" signal so that the up-down counter 8 counts up the clock signals, and if a condition of Vr<Vc is met, the comparator 23 delivers a "0" signal so that the up-down counter 8 counts down the clock signals. In other words, the circuit portion encircled by a one-dot-chain line 24 in FIG. 2 operates to make the control voltage Vc coincide with the voltage Vr, during the time the variable resistor 10 is under the depression manipulation. Thus, the circuit portion 24 as a whole may be expressed as another proper term such as a servo control system. It is appreciated that the response time of the servo control system 24 is quite short since the time interval of the clock signals is extremely short.

In the servo control system 24, if a condition of Vc=Vr is met and the depression manipulation of the variable resistor 10 is released, then the output of the touch detector 21 changes to a "0" signal thereby preventing the application of the clock signals to the up-down counter 8. Thus, the control voltage Vc remains unchanged or held as it is, until a next depression manipulation of the variable resistor 10 is again carried out. Therefore, according to the embodiment of the invention, the control voltage Vc can be varied quickly and precisely in response to the depression of the variable resistor. Moreover, since the value of the control voltage Vc is related to the position along the longitudinal direction of the elastic conductor where an operator touches or presses, a visual recognition of the value can readily be obtained.

Figure 8:
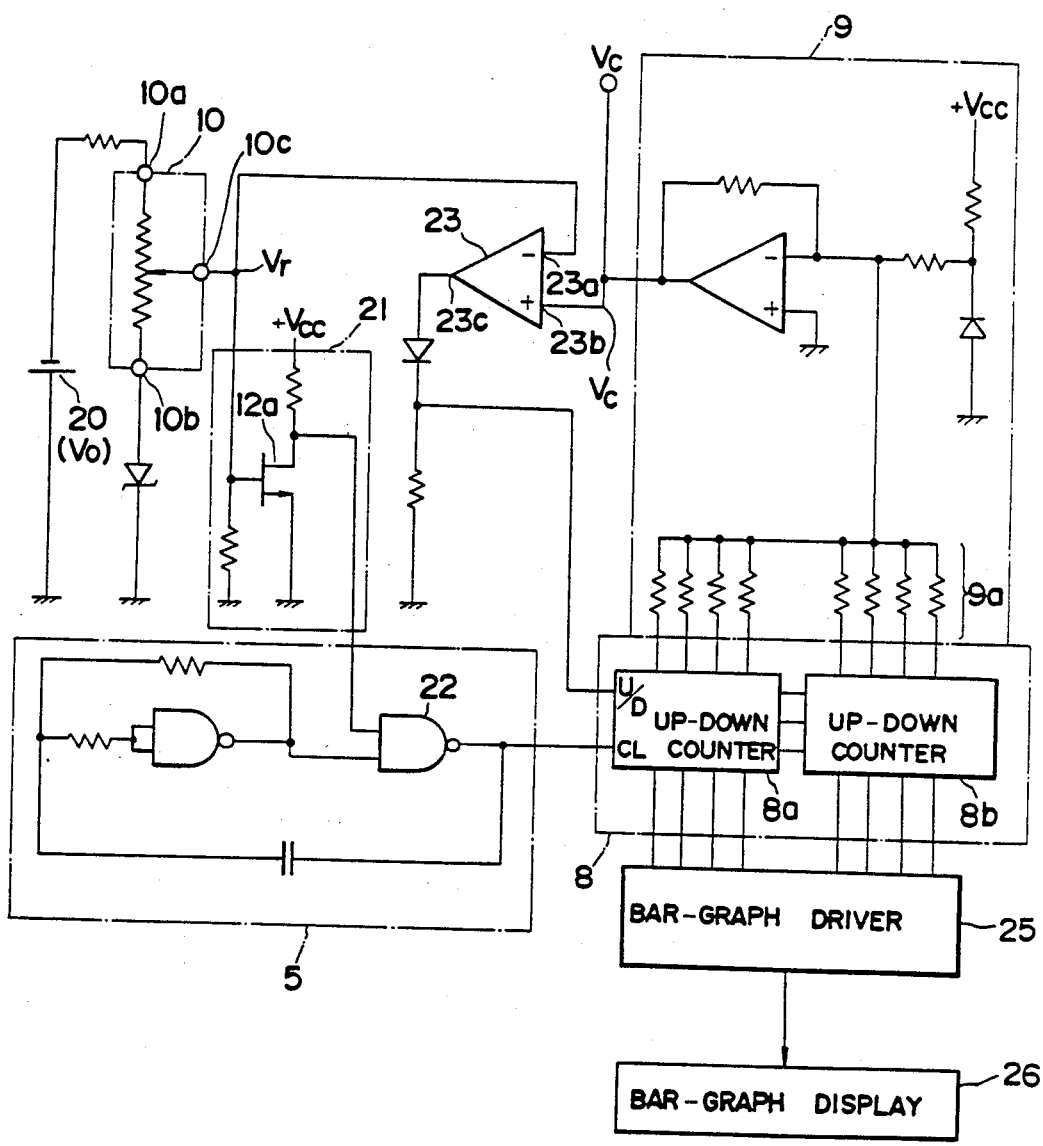
FIG. 8 is a concrete circuit diagram partially shown in blocks of the circuit shown in FIG. 2.

A more concrete circuit of the above embodiment will be described hereinunder. FIG. 8 is a schematic circuit diagram of the concrete circuit, in which identical reference numerals have been used to designate corresponding parts of FIG. 2. In FIG. 8, the touch detector 21 comprises a field effect transistor 12a, the gate of which being applied with the voltage Vr from the terminal 10c of the variable resistor 10, and the drain of which being coupled to one input terminal of the AND gate 22. The clock generator 5 comprises a free running multivibrator using the AND gate 22 as one of its constitutional elements. The up-down counter 8 comprises two cascode connected up-down counters 8a and 8b each output of which drives a set of weighting resistors 9a in the D/A converter 9 and a bar-graph driver 25 for driving a bar-graph display 26 so as to display in a bar-graph a value corresponding to the count contents of the up-down counter 8, i.e., the control voltage Vc. However, it is to be noted that other display devices such as a numerical display device or the like may be utilized in lieu of the bar-graph display 26.

While there has been shown and described specific embodiments of the present invention, it will be obvious to those skilled in the art that various changes and modifications may be made without departing from the invention in its broader aspects; and, therefore, it is intended that the appended claims cover all such changes and modifications as fall within the true spirit and scope of the invention.

What is claimed is:

1. A device for generating a variable and adjustable control signal comprising:

variable voltage generating means which is capable of delivering a voltage in response to manipulation thereof, the level of the thus delivered voltage corresponding to a location along a dimension of said variable voltage generating means to which the manipulation is applied, means responsive to lack of manipulation for inhibiting said voltage generating means from delivering a voltage;

holding circuit means coupled to said variable voltage generating means for delivering a first signal corresponding to said voltage delivered under manipulation, and holding a voltage corresponding to the previously manipulated location and delivering a second signal corresponding to said held voltage during the time said voltage generating means is not manipulated; and, an output terminal coupled to the output of said holding circuit means for receiving either one of said first and second signals as a control signal variably adjusted by manipulation of said voltage generating means.

2. A device for generating a control signal according to claim 1, in which said output terminal receives as the control signal said first signal during manipulation of said generating means and said second signal during non-manipulation of said generating means.

3. A device for generating a control signal according to claim 2, in which said variable voltage generating means comprises:

a resistive body adapted to be applied with a constant voltage across opposite ends thereof;

a conductive body disposed in spaced confronting alignment with said resistive body, said conductive body being electrically coupled to the corresponding location of said resistive body where said conductive body is depressed under manipulation of said variable voltage generating means, whereby a variable voltage is developed across one end of said resistive body and said conductive body.

4. A device for generating a control signal according to claim 2, in which said holding circuit means comprises:

detecting means for detecting either one of manipulation state and non-manipulation state of said variable voltage generating means;

control means responsive to the output of said detecting means for controlling to operate said holding circuit means in either one of a holding operation and a renewal operation of the contents of said holding circuit means;

a hold circuit under control of said control means capable of taking said renewal operation when said detecting means detects said manipulation state and capable of taking said holding operation when said detecting means detects said non-manipulation state, the output of said hold circuit being coupled to said output terminal; and a comparator for comparing the output of said variable voltage generating means with the output of said hold circuit, the comparison result being used to control said hold circuit for the renewal of said contents in such a way that said two outputs to be compared become in coincidence with each other.

5. A device for generating a control signal according to claim 4, in which said hold circuit comprises an up-down counter having a clock input terminal and an up-down changeover terminal connected to the output terminal of said comparator, and a digital to analog converter for digital-analog converting the output of said up-down counter; and said control means comprises a clock generator for generating clock signals with a constant time interval, and coupling means for coupling the output of said clock generator with the clock input terminal of said up-down counter when said detecting means detects said manipulation state.

6. A device for generating a control signal according to claim 5, in which said coupling means comprises an AND gate one of the inputs thereof being coupled to the output of said clock generator, the other being coupled to the output of said detecting means, and the output thereof being coupled to the clock terminal of said up-down counter.

7. A device for generating a control signal according to claim 6, in which said detecting means detects said manipulation state when the output of said variable voltage generating means thereof has a larger value than a predetermined value, and detects said non-manipulation state when the output thereof has a smaller value than said predetermined value.

8. A device for generating a control signal according to claim 5, further comprising a display means for displaying the value of the output of said hold circuit in accordance with the output of said up-down counter.

* * * * *